US010312667B2

(12) United States Patent
Hashimoto (10) Patent No.: US 10,312,667 B2
(45) Date of Patent: Jun. 4, 2019

(54) QUANTUM CASCADE LASER

(71) Applicant: SUMITOMO ELECTRIC INDUSTRIES, LTD., Osaka (JP)

(72) Inventor: Jun-ichi Hashimoto, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/834,753

(22) Filed: Dec. 7, 2017

(65) Prior Publication Data
US 2018/0166860 A1    Jun. 14, 2018

(30) Foreign Application Priority Data

Dec. 8, 2016   (JP) ................................ 2016-238726

(51) Int. Cl.
*H01S 5/02*    (2006.01)
*H01S 5/12*    (2006.01)
(Continued)

(52) U.S. Cl.
CPC ............ *H01S 5/3402* (2013.01); *H01S 5/164* (2013.01); *H01S 5/227* (2013.01); *H01S 5/2226* (2013.01);
(Continued)

(58) Field of Classification Search
CPC ................ H01S 5/3401; H01S 5/3402; H01S 5/16–5/168; H01S 2301/176;
(Continued)

(56) References Cited

U.S. PATENT DOCUMENTS 4,553,239 A * 11/1985 Akiba ....................... H01S 5/12
                                                           372/44.01
5,202,948 A *  4/1993 Suhara .................. H01S 5/1082
                                                           385/131
(Continued)

FOREIGN PATENT DOCUMENTS

JP          58141587 A *   8/1983   ............... H01S 5/10

OTHER PUBLICATIONS

Aellen, Thierry, et al., Continuous-wave distributed-feedback quantum-cascade lasers on a Peltier cooler, *Applied Physics Letters*, Sep. 8, 2003, vol. 83 No. 10, p. 1929-p. 1931.

*Primary Examiner* — Joshua King
(74) *Attorney, Agent, or Firm* — Smith, Gambrell & Russell, LLP.

(57) ABSTRACT

A quantum cascade laser includes a laser structure including first and second end faces, the laser structure including a semiconductor laminate region and a first embedding semiconductor region. The laser structure includes first and second regions arranged in a direction of a first axis extending from the first to second end faces. Each of the first and second regions includes the semiconductor laminate region. The semiconductor laminate region of the first region has a first recess. The semiconductor laminate region of the second region has a semiconductor mesa. The first recess and the semiconductor mesa extend in the direction of the first axis, and are aligned with each other. The semiconductor mesa has an end face extending in a direction of a second axis intersecting the first axis. The first embedding semiconductor region is disposed in the first recess so as to embed the end face of the semiconductor mesa.

20 Claims, 7 Drawing Sheets

(51) Int. Cl.
*H01S 5/16* (2006.01)
*H01S 5/22* (2006.01)
*H01S 5/34* (2006.01)
*B82Y 20/00* (2011.01)
*H01S 5/028* (2006.01)
*H01S 5/227* (2006.01)

(52) U.S. Cl.
CPC ............ *B82Y 20/00* (2013.01); *H01S 5/0202* (2013.01); *H01S 5/0281* (2013.01); *H01S 5/12* (2013.01); *H01S 5/2224* (2013.01); *H01S 5/2275* (2013.01)

(58) Field of Classification Search
CPC .... H01S 5/0287; H01S 5/0282–5/0283; H01S 5/1082
See application file for complete search history.

(56) References Cited

U.S. PATENT DOCUMENTS

| | | | | |
|---|---|---|---|---|
| 9,184,563 | B1* | 11/2015 | Raring | H01S 5/2201 |
| 2004/0165635 | A1* | 8/2004 | Sugimoto | B82Y 20/00 |
| | | | | 372/46.01 |
| 2004/0233950 | A1* | 11/2004 | Furukawa | H01S 5/028 |
| | | | | 372/43.01 |
| 2005/0041709 | A1* | 2/2005 | Anikitchev | B82Y 20/00 |
| | | | | 372/46.016 |
| 2008/0069165 | A1* | 3/2008 | Peters | H01S 5/16 |
| | | | | 372/46.01 |
| 2008/0259982 | A1* | 10/2008 | Kim | B82Y 20/00 |
| | | | | 372/44.01 |
| 2010/0202480 | A1* | 8/2010 | Kuramoto | B82Y 20/00 |
| | | | | 372/38.05 |
| 2010/0284435 | A1* | 11/2010 | Achtenhagen | H01S 5/125 |
| | | | | 372/50.1 |
| 2011/0164642 | A1* | 7/2011 | Onishi | H01S 5/02461 |
| | | | | 372/46.012 |
| 2012/0250717 | A1* | 10/2012 | Lauer | H01S 5/0425 |
| | | | | 372/45.01 |
| 2012/0270347 | A1* | 10/2012 | Yagi | H01S 5/1231 |
| | | | | 438/31 |
| 2013/0244363 | A1* | 9/2013 | Yoneda | H01S 5/0425 |
| | | | | 438/39 |
| 2014/0233596 | A1* | 8/2014 | Fang | H01S 5/1082 |
| | | | | 372/45.012 |
| 2014/0239250 | A1* | 8/2014 | Fang | H01L 33/06 |
| | | | | 257/13 |
| 2014/0247851 | A1* | 9/2014 | Hashimoto | B82Y 20/00 |
| | | | | 372/45.012 |
| 2015/0318668 | A1* | 11/2015 | Yoshinaga | H01S 5/3401 |
| | | | | 372/45.012 |
| 2015/0357794 | A1* | 12/2015 | Tsuji | H01S 5/3402 |
| | | | | 372/45.012 |

* cited by examiner

QUANTUM CASCADE LASER

BACKGROUND OF THE INVENTION

Field of the Invention

The present invention relates to a quantum cascade laser. This application claims the benefit of priority from Japanese Patent application No. 2016-238726 filed on Dec. 8, 2016, which is herein incorporated by reference in its entirety.

Related Background Art

Non-Patent Document (Applied Physics Letters, vol. 83, pp. 1929-1931, 2003) discloses a mid-infrared quantum cascade semiconductor laser of a group III-V compound semiconductor.

SUMMARY OF THE INVENTION

A quantum cascade laser according to one aspect of the present invention includes a laser structure including a first end face and a second end face opposite to the first end face, the laser structure including a substrate having a principal surface, a semiconductor laminate region, and a first embedding semiconductor region, the semiconductor laminate region and the first embedding semiconductor region being disposed on the principal surface of the substrate, the laser structure including a first region and a second region that are arranged in a direction of a first axis extending from the first end face to the second end face. Each of the first region and the second region includes the semiconductor laminate region. The semiconductor laminate region of the first region has a first recess extending in the direction of the first axis. The semiconductor laminate region of the second region has a semiconductor mesa extending in the direction of the first axis, the semiconductor mesa having a core layer. The semiconductor mesa has an end face extending in a direction of a second axis intersecting the first axis. The semiconductor mesa and the first recess are aligned with each other. In addition, the first embedding semiconductor region is disposed in the first recess so as to embed the end face of the semiconductor mesa.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

DESCRIPTION OF THE EMBODIMENTS

Inventor's findings reveal that covering the end face of the core layer of a quantum cascade semiconductor laser with a semiconductor region is advantageous. This covering can avoid the exposure of the core layer, which is in the path of current flowing in operation, to the atmosphere, which contains oxygen and water.

The covering can be formed in a following manner: a semiconductor mesa including the core layer therein is embedded with a semiconductor layer to form an embedding region; and the embedding region covers the end face of the semiconductor mesa.

The above fabrication allows the semiconductor mesa to have the end face thereof covered by the semiconductor region. Inventor's observation shows that the thickness of the semiconductor region decreases with the distance from the end face of the semiconductor mesa, so that the semiconductor region does not have a desired planar surface. In the vicinity of the end face of the semiconductor mesa, the semiconductor region with the low planarity diffusely reflects light from the end face of the semiconductor mesa.

Some specific embodiments according to the present above aspect are described below.

A quantum cascade laser according to an embodiment includes a laser structure including a first end face and a second end face opposite to the first end face, the laser structure including a substrate having a principal surface, a semiconductor laminate region, and a first embedding semiconductor region, the semiconductor laminate region and the first embedding semiconductor region being disposed on the principal surface of the substrate, the laser structure including a first region and a second region that are arranged in a direction of a first axis extending from the first end face to the second end face. Each of the first region and the second region includes the semiconductor laminate region. The semiconductor laminate region of the first region has a first recess extending in the direction of the first axis. The semiconductor laminate region of the second region has a semiconductor mesa extending in the direction of the first axis, the semiconductor mesa having a core layer. The semiconductor mesa has an end face extending in a direction of a second axis intersecting the first axis. The semiconductor mesa and the first recess are aligned with each other. In addition, the first embedding semiconductor region is disposed in the first recess so as to embed the end face of the semiconductor mesa.

In the quantum cascade semiconductor laser, the first recess in the first region reaches the end face of the semiconductor mesa, which is located in the second region. In the first region, the semiconductor laminate region includes a first side face and a second side face, which defines the first recess. The arrangement of the first recess in the first region and the semiconductor mesa in the second region allows the first embedding semiconductor region to embed the first and second side faces and the end face of the semiconductor mesa. The first embedding semiconductor region is provided in the first recess by deposition. The first embedding semiconductor region is selectively grown on a limited area, which is isolated from others in one direction and/or another direction by the arrangement of the first and second regions of the laser structure, to have a desired flatness. In the first region, the end face of the semiconductor mesa is covered with the first embedding semiconductor region with a good planarity. The first embedding semiconductor region is supported at the three sides thereof.

In the quantum cascade laser according to an embodiment, preferably, the semiconductor laminate region includes a first laminate structure and a second laminate structure each extending in the direction of the first axis. In the second region, the semiconductor mesa is disposed between the first laminate structure and the second laminate structure. In the first region, the first recess is defined by an arrangement of the first laminate structure and the second laminate structure. The second region of the laser structure includes a second embedding semiconductor region. In the second region, the second embedding semiconductor region is disposed between the first laminate structure and the semiconductor mesa and between the second laminate structure and the semiconductor mesa.

The quantum cascade laser may provide the semiconductor laminate region with not only the semiconductor mesa but also the first laminate structure and the second laminate structure, which extend in the direction of the first axis. The first and second laminate structures define the first recess in the first region, and extend from the first region to the second region. The extensions of the first and second laminate structures may define a second recess and a third recess in the second region. Specifically, the second recess is disposed between the first laminate structure and the semiconductor mesa, and the third recess is disposed between the second laminate structure and the semiconductor mesa. The second embedding semiconductor region is disposed both in the second recess and the third recess. The second and third recesses extend in the direction of the first axis. The second embedding semiconductor region is selectively grown in a limited area(s), which is isolated from others by the extensions of the first and second laminate structures in the second region, to have a desired flatness. The second embedding semiconductor region with a good planarity may provide the side faces of the semiconductor mesa with respective planar embedding portions.

In the quantum cascade laser according to an embodiment, preferably, the semiconductor laminate region of the first region includes a connecting laminate structure. In addition, the first laminate structure and the second laminate structure reach the connecting laminate structure.

The quantum cascade laser may include the connecting laminate structure, which provides a bridge structure between the first and second laminate structures to terminate the first recess. The connecting laminate structure has a side face that terminates the first recess. The first recess starts from the side face of the connecting laminate structure, and is guided by the side face of the first laminate structure and the side face of the second laminate structure to the end face of the semiconductor mesa. The addition of the connecting laminate structure connected to the first and second laminate structures may limit an area on which semiconductor for the first embedding semiconductor region grows.

In the quantum cascade laser according to an embodiment, preferably, the first embedding semiconductor region and the semiconductor laminate region of the first region reach the first end face.

The quantum cascade laser allows the first embedding semiconductor region to extend along the side faces of the first recess to the upper edge of the first end face of the substrate. The first laminate structure, the second laminate structure, and the first embedding semiconductor region of the semiconductor laminate region form the first end face.

In the quantum cascade laser according to an embodiment, preferably, the first embedding semiconductor region includes at least one of undoped semiconductor or semi-insulating semiconductor.

The quantum cascade semiconductor laser may use semiconductor of a high specific resistance, such as undoped and semi-insulating semiconductors, to reduce leakage current and optical absorption caused by carriers.

In the quantum cascade laser according to an embodiment, preferably, the first embedding semiconductor region is made of at least one of InP or InGaAsP.

The quantum cascade semiconductor laser may include semiconductor material of InP or InGaAsP, which do not contain any aluminum as a constituent element, to avoid deterioration due to the oxidation of semiconductor.

In the quantum cascade laser according to an embodiment, preferably, the laser structure further includes a current blocking region disposed on a side face of the semiconductor mesa, the current blocking region embedding the semiconductor mesa. The first embedding semiconductor region is made of substantially the same material as that of the current blocking region in constituent elements and composition of the first embedding semiconductor region.

The quantum cascade semiconductor laser may include substantially the same material in the first embedding semiconductor region and the current blocking layer to form them in the same growing step together.

In the quantum cascade laser according to an embodiment, preferably, the substrate has a ridge portion on which the semiconductor mesa is disposed. The substrate is made of semiconductor having cleavability. The semiconductor laminate region is made of semiconductor having cleavability. In addition, the first embedding semiconductor region is made of semiconductor having cleavability.

In the quantum cascade semiconductor laser, the laser structure including semiconductor having cleavability includes an end face including a cleavage plane orientation.

Teachings of the present invention can be readily understood by considering the following detailed description with reference to the accompanying drawings shown as examples. Referring to the accompanying drawings, embodiments of a quantum cascade laser, and a method for fabricating a quantum cascade laser according to the present invention will be described below. To facilitate understanding, identical reference numerals are used, where possible, to designate identical elements that are common to the figures.

Figure 1:
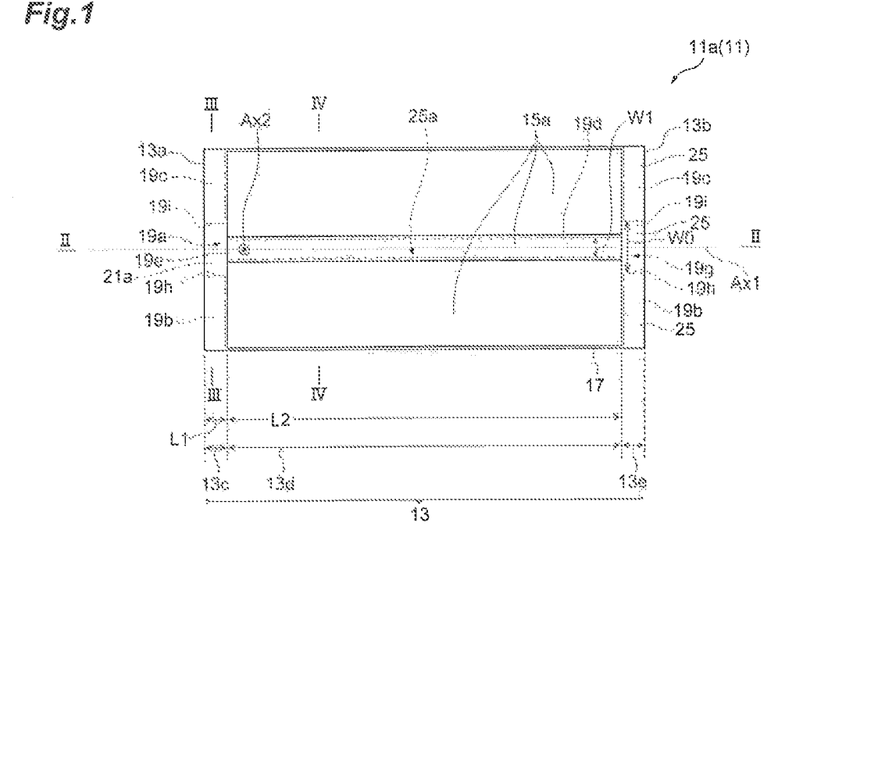
FIG. 1 is a plan view showing a quantum cascade laser according to the present embodiment.
Figure 2:
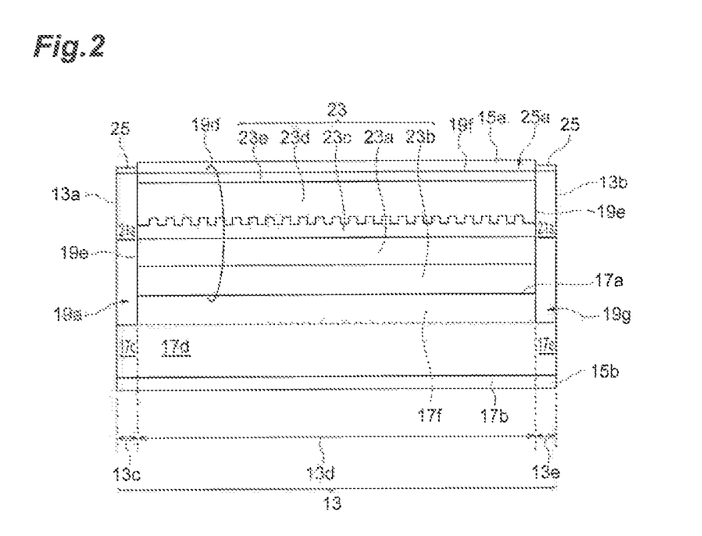
FIG. 2 is a cross-sectional view taken along line II-II in FIG. 1.
Figure 3:
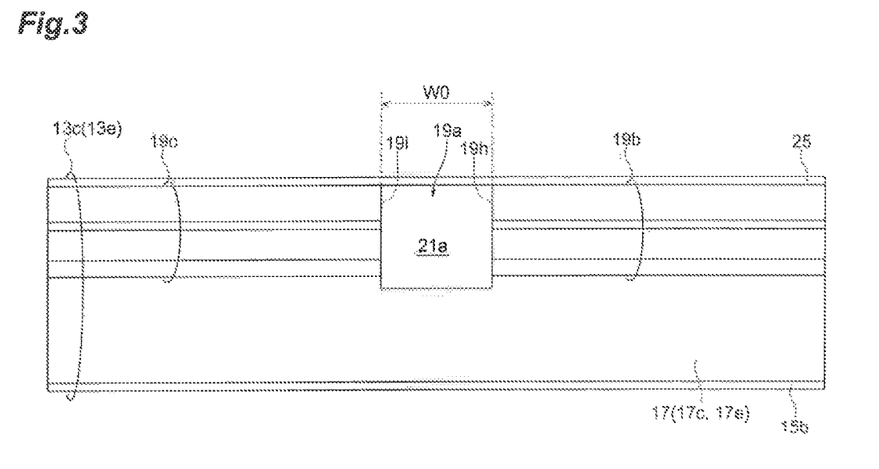
FIG. 3 is a cross-sectional view taken along line III-III shown in FIG. 1.
Figure 4:
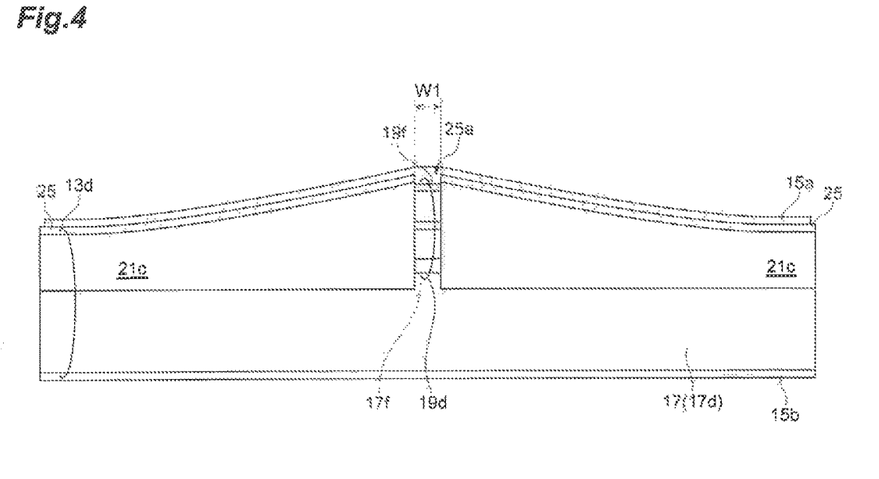
FIG. 4 is a cross-sectional view taken along line IV-IV shown in FIG. 1.
Figure 5:
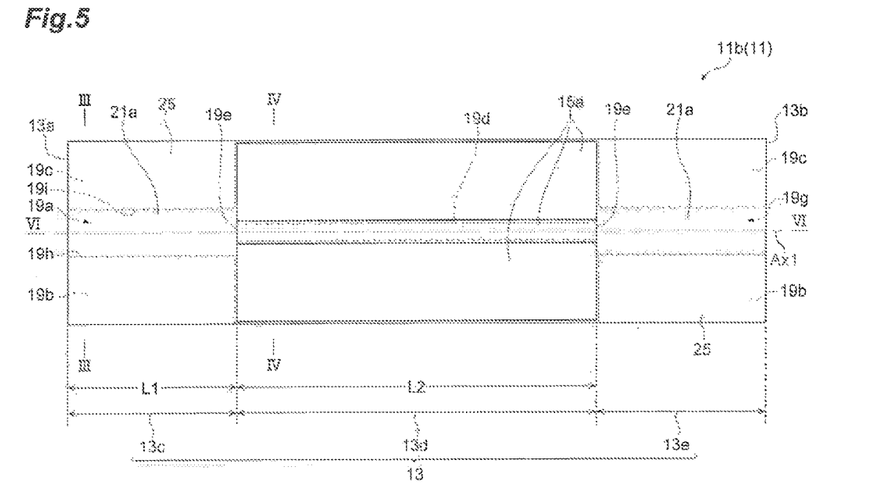
FIG. 5 is a plan view showing a quantum cascade laser according to the present embodiment.
Figure 6:
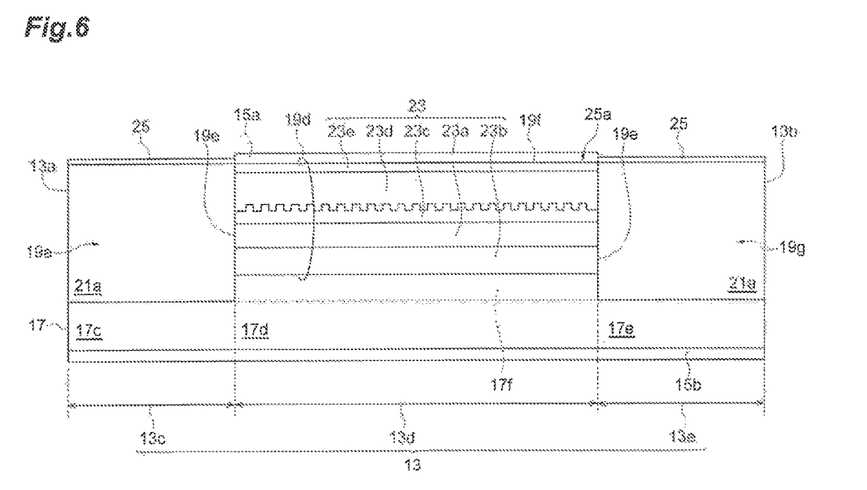
FIG. 6 is a cross-sectional view taken along line VI-VI shown in FIG. 5.
Figure 7:
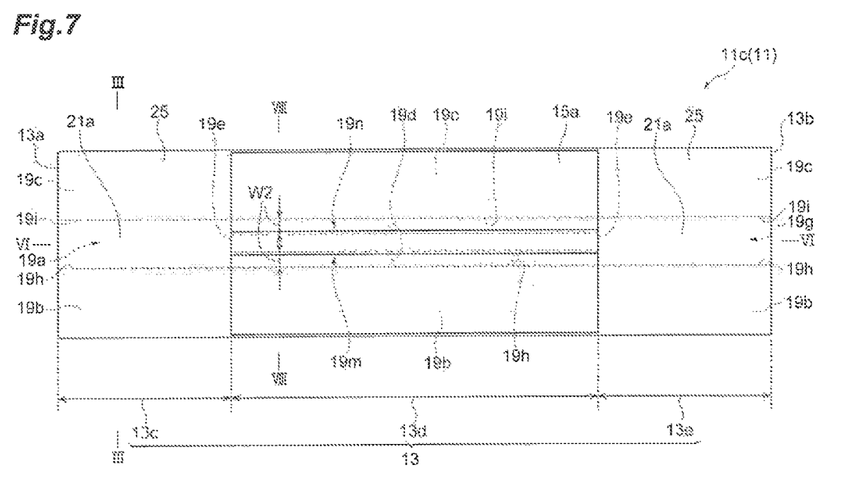
FIG. 7 is a plan view showing a quantum cascade laser according to the present embodiment.
Figure 8:
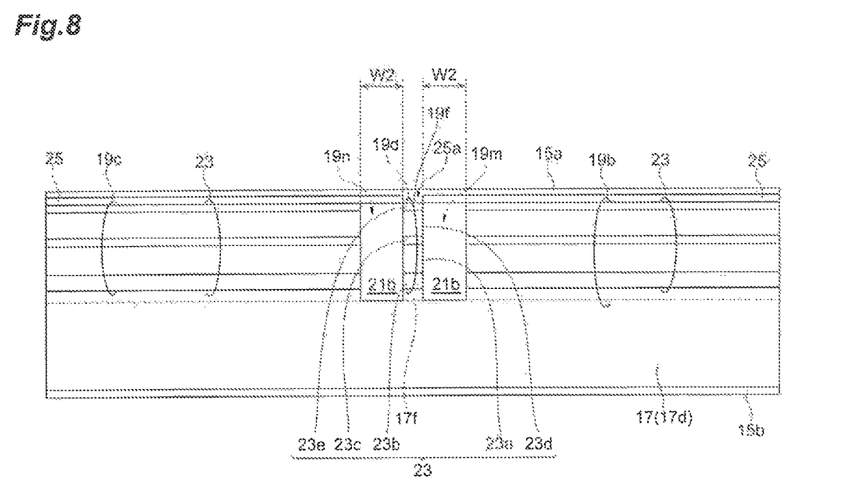
FIG. 8 is a cross-sectional view taken along line VIII-VIII shown in FIG. 7.
Figure 9:
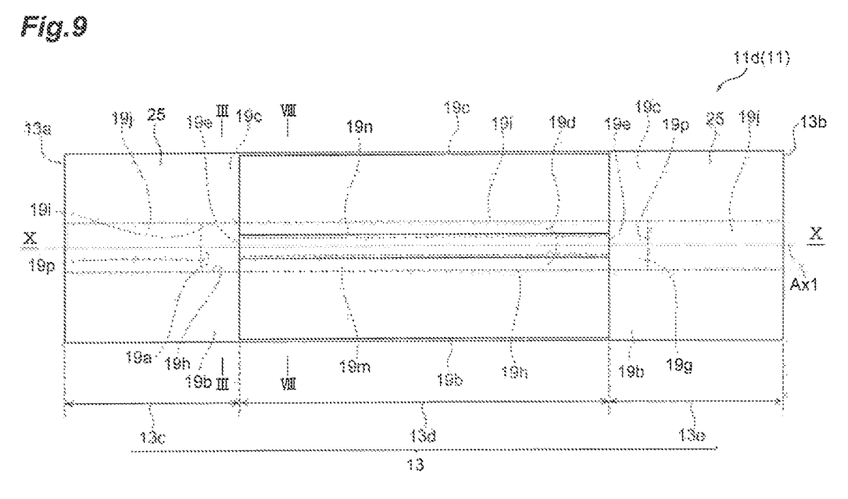
FIG. 9 is a plan view showing a quantum cascade laser according to the present embodiment.
Figure 10:
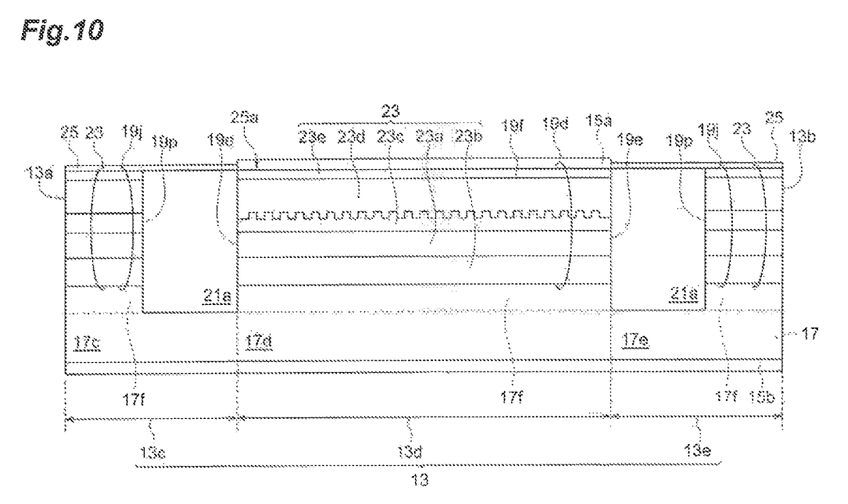
FIG. 10 is a cross-sectional view taken along line X-X shown in FIG. 9.

FIG. 1 is a plan view showing a distributed feedback quantum cascade laser (11a) according to the present embodiment. FIG. 2 is a cross-sectional view taken along line II-II in FIG. 1. FIG. 3 is a cross-sectional view taken along line III-III shown in FIG. 1. FIG. 4 is a cross-sectional view taken along line IV-IV shown in FIG. 1. FIG. 5 is a plan view showing a distributed feedback quantum cascade laser (11b) according to the present embodiment. FIG. 6 is a cross-sectional view taken along line VI-VI shown in FIG. 5. FIG. 7 is a plan view showing a distributed feedback quantum cascade laser (11c) according to the present embodiment. FIG. 8 is a cross-sectional view taken along line VIII-VIII shown in FIG. 7. FIG. 9 is a plan view showing a distributed feedback quantum cascade semiconductor laser (11d) according to the present embodiment. FIG. 10 is a cross-sectional view taken along line X-X shown in FIG. 9.

With reference to FIGS. 1 to 10, a quantum cascade laser according to the above embodiments will be described below. The quantum cascade laser 11 (11a, 11b, 11c, and 11d) includes a laser structure 13, a first electrode 15a, and a second electrode 15b. The laser structure 13 has a first end face 13a and a second end face 13b. The laser structure 13 includes a substrate 17, a semiconductor laminate region 19, and a first embedding semiconductor region 21a. The semiconductor laminate region 19 and the first embedding semiconductor region 21a are disposed on the principal surface 17a of the substrate 17. The laser structure 13 includes a first region 13c, a second region 13d, and a third region 13e. The second region 13d is disposed between the first region 13c and the third region 13e. The first region 13c, the second region 13d, and the third region 13e are arranged in the direction of the first axis Ax1 from the first end face 13a to the second end face 13b. The third region 13e may have the same structure as, for example, the first region 13c, but is not limited to the same structure. The first region 13c and the second region 13d each include the substrate 17, and further include the semiconductor laminate region 19. The semiconductor laminate region 19 of the first region 13c and the third region 13e includes the respective first recesses 19a and 19g, each of which extends in the direction of the first axis Ax1. The semiconductor laminate region 19 of the second region 13d has a semiconductor mesa 19d, which also extends in the direction of the first axis Ax1. The semiconductor mesa 19d has an end face 19e extending in a direction of a second axis Ax2 intersecting the first axis Ax1. The width W1 of the semiconductor mesa 19d is in the range of, for example, 3 to 20 micrometers. The first recess 19a and the semiconductor mesa 19d are aligned in a line. Specifically, the first recess 19a and the semiconductor mesa 19d are arranged in the direction of the first axis Ax1. The first embedding semiconductor region 21a of the first region 13c is disposed in the first recess 19a of the first region 13c to embed the end face 19e of the semiconductor mesa 19d.

The semiconductor mesa 19d includes a core layer 23a for quantum cascade laser. In particular, the semiconductor mesa 19d includes a semiconductor laminate 23, which has, in addition to the core layer 23a, for example, a lower cladding layer 23b, a grating layer 23c, an upper cladding layer 23d, and a contact layer 23e. The semiconductor laminate region 19 of the first region 13c includes a first laminate structure 19b and the second laminate structure 19c, and in the present embodiment, each of the first and second laminate structures 19b and 19c includes the semiconductor laminate 23.

Specifically, the substrate 17 includes a first substrate portion 17c, a second substrate portion 17d, and a third substrate portion 17e, which are associated with the first region 13c, the second region 13d, and the third region 13e, respectively.

In the present embodiment, the substrate 17 can be made of, for example, a conductive semiconductor. The first electrode 15a is connected to the contact layer 23e of the semiconductor mesa 19d, and the second electrode 15b is connected to the lower cladding layer 23b via the substrate 17. In the second region 13d, the top face of the laser structure 13 is covered with an insulating film 25, and the insulating film 25 has an opening 25a, which is located on the top face 19f of the semiconductor mesa 19d. The first electrode 15a makes contact with the upper face 19f of the semiconductor mesa 19d via the opening 25a, and the second electrode 15b is connected to the back face 17b of the substrate 17.

In the quantum cascade semiconductor laser 11 (11a, 11b, 11c and 11d), the first recess 19a in the first region 13c reaches the end face 19e of the semiconductor mesa 19d, which is located in the second region 13d. In the first region 13c, the semiconductor laminate region 19 includes a first side face 19h and a second side face 19i, which define the first recess 19a. The arrangement of the first recess 19a in the first region 13c and the semiconductor mesa 19d in the second region 13d allows the first embedding semiconductor region 21a, which is provided in the first recess 19a by embedding growth, to embed the first and second side faces 19h and 19i and the end face 19e of the semiconductor mesa 19d. In the embedding growth, the first embedding semiconductor region 21a is formed by selective growth on a limited area, which is isolated from others in one direction and/or another direction by the arrangement of the semiconductor laminate region 19 in the first region 13c and the semiconductor mesa 19d in the second region 13d, to obtain a desired flatness. In the first region 13c, the end face 19e of the semiconductor mesa 19d is covered by the first embedding semiconductor region 21a with a good planarity. The embedding semiconductor region 21a is supported at the three sides of the semiconductor laminate region 19.

The first embedding semiconductor region 21a may include at least one of an undoped semiconductor or a semi-insulating semiconductor. Semiconductors that exhibit high resistivity, such as undoped and semi-insulating semiconductors, can reduce leakage current and light absorption caused by carriers therein. Specifically, the first embedding semiconductor region 21a may include, for example, at least one of InP or InGaAsP. InP and InGaAsP do not contain aluminum as a constituent element, and can avoid degradation due to the oxidation.

The substrate 17 is etched deeply in order to form the semiconductor mesa 19d, and has a ridge portion 17f. The semiconductor mesa 19d is disposed on the ridge portion 17f. The substrate 17 may be made of a semiconductor having a cleavage property, for example, InP. The laser structure 13 is also made of a semiconductor having the property of cleavage. The first embedding semiconductor region 21a is made of a semiconductor having the property of cleavage. The first and second end faces 13a and 13b of the laser structure 13 each have a cleavage plane with a particular crystal orientation.

With reference to FIGS. 1 to 4, the quantum cascade semiconductor laser 11a according to the present embodiment will be described below. In the quantum cascade semiconductor laser 11a, the first recess 19a of the semiconductor laminate region 19 extends from the first end face 13a (specifically, the upper edge of the first substrate portion 17c) in the first region 13c in the direction of the first axis Ax1, and terminates at the end face 19e of the semiconductor mesa 19d of the semiconductor laminate region 19. The first recess 19a is filled with the first embedding semiconductor region 21a. In the fabricating process for selective growth, the first recesses 19a have shapes of grooves in sections for semiconductor chips, and the grooves in adjoining sections are connected at the boundaries of the adjoining sections to form a connected single groove. Specifically, the single groove is defined by both the end faces 19e of the semiconductor mesas 19d, and the first and second side faces 19h and 19i of the semiconductor laminate regions 19 of the first regions 13c in the individual sections. In the first region 13c, the semiconductor laminate region 19 allows selective growth of semiconductor to occur in a smaller area surrounded by the end faces 19e and the first and second side faces 19h and 19i. In the second region 13d, the semiconductor laminate region 19 allows selective growth of semiconductor to occur in a wider area, which is surrounded by the semiconductor laminate regions 19 of the first regions 13c and the side faces of the semiconductor mesas 19d and associated with the length of the semiconductor mesa and the interval of the semiconductor mesas in adjoining sections, thereby forming a current blocking region 21c which embeds the side faces of the semiconductor mesa 19d. The current blocking region 21c is formed of a highly resistive semiconductor, and can confine current into the semiconductor mesa 19d. The highly resistive semiconductor encompasses undoped and semi-insulating semiconductors, which the first embedding semiconductor region 21a uses. The highly resistive semiconductor, such as undoped and semi-insulating semiconductors, can reduce leakage current flowing outside of the semiconductor mesa 19d and light absorption caused by carriers. The first embedding semiconductor region 21a in the first region 13c, shown in FIGS. 2 and 3, has a flatness superior to that of the current blocking region 21c in the second region 13d as shown in FIG. 4.

As described above, the laser structure 13 further includes the current blocking region 21c disposed on the side faces of the semiconductor mesa 19d so as to embed the semiconductor mesa 19d. The material of the first embedding semiconductor region 21a is substantially the same as that of the current blocking region 21c in terms of constituent elements and composition. Using substantially the same material makes it possible to form the first embedding semiconductor region 21a and the current blocking region 21c in a single growing process together. This simultaneous growth can simplify the fabricating process.

The quantum cascade laser 11a has an optical cavity including the first and second end faces 13a and 13b. As shown in FIGS. 1 and 2, the first length L1 of the first region 13c is smaller than the second length L2 of the second region 13d, and is, for example, in the range of 0.5 to 50 micrometers. The diffraction grating layer 23c has a periodic structure that determines the lasing wavelength. As shown in FIGS. 1 and 3, the width W0 of the first recess 19a can be in the range of, for example, 10 to 70 micrometers.

With reference to FIGS. 5 to 6, the quantum cascade laser 11b according to the present embodiment will be described below. The first length L1 of the first region 13c in the quantum cascade laser 11b is larger than the first length L1 of the first region 13c in the quantum cascade laser 11a. The quantum cascade laser 11b has the same structure as that of the quantum cascade semiconductor laser 11a, except for the above matter. As shown in FIG. 6, the first recess 19a is filled with the first embedding semiconductor region 21a, and in the quantum cascade laser 11b, the first embedding semiconductor region 21a of the first region 13c has an excellent flatness like the first embedding semiconductor region 21a of the first region 13c of the quantum cascade laser 11a.

With reference to FIGS. 7 to 8, the quantum cascade laser 11c according to the present embodiment will be described below. In the quantum cascade laser 11c, as shown in FIG. 7, the first recess 19a is filled with the first embedding semiconductor region 21a, so that the first embedding semiconductor region 21a of the first region 13c has an excellent flatness like the first embedding semiconductor region 21a of the first region 13c of the quantum cascade laser 11a.

The semiconductor laminate region 19 of the second region 13d includes the first laminate structure 19b and the second laminate structure 19c like those of the first region 13c. In the present embodiment, each of the first laminate structure 19b and the second laminate structure 19c in the second region 13d also includes the laminate structure 23. In the quantum cascade laser 11c, the first and second laminate structures 19b and 19c extend from the first end face 13a to the second end face 13b in the direction of the first axis Ax1.

In the second region 13d, the semiconductor mesa 19d is disposed between the first and second laminate structures 19b and 19c of the second region 13d. The first and second laminate structures 19b and 19c of the semiconductor laminate region 19 in the second region 13d connects the first and second laminate structures 19b and 19c in the first region 13c to the first and second laminate structures 19b and 19c in the third region 13e, respectively. As already described above, in the first region 13c, the first recess 19a is defined by the first and second laminate structures 19b and 19c of the semiconductor laminate region 19.

In the quantum cascade laser 11c, the second region 13d includes a second embedding semiconductor region 21b, which is disposed between the first laminate structure 19b and the semiconductor mesa 19d and between the second laminate structure 19c and the semiconductor mesa 19d. The quantum cascade laser 11c has the same structure as that of the quantum cascade semiconductor laser 11b except for the above matter.

The quantum cascade semiconductor laser 11c allows the semiconductor laminate region 19 to include the first and second laminate structures 19b and 19c, in addition to the semiconductor mesa 19d, which extend in the direction of the first axis and are arranged in the second region 13d. The first and second laminate structures 19b and 19c define the first recess 19a (19g) in the first region 13c, and extend from the first region 13c to the second region 13d, and in the present embodiment, further extends to the third region 13e. The extensions of the first and second laminate structures 19b and 19c can provide a second recess 19m and a third recess 19n in the second region 13d. Specifically, the second recess 19m is defined by the first laminate structure 19b and the semiconductor mesa 19d, and the third recess 19n is defined by the second laminate structure 19c and the semiconductor mesa 19d. The second and third recesses 19m and 19n extend in the direction of the first axis Ax1. The second embedding semiconductor region 21b is selectively grown on an area isolated from others in one or more directions by the extensions of the first and second laminate structures 19b and 19c, and has an excellent flatness. The second embedding semiconductor region 21b embeds the second recess 19m between the first laminate structure 19b and the semiconductor mesa 19d, and the third recess 19n between the second laminate structure 19c and the semiconductor mesa 19d to enable planarization thereof. The second embedding semiconductor region 21b having the good planarity covers the side faces of the semiconductor mesa to provide the surface of the embedding region with the good flatness.

In the present embodiment, the second and third recesses 19m and 19n connect the first recess 19a of the first region 13c and the first recess 19g of the third region 13e to each other. In the second region 13d, the side faces of the semiconductor mesa 19d are embedded with the second embedding semiconductor region 21b of a desired insulating property. In the first region 13c, the end face 19e of the semiconductor mesa 19d is embedded with the first embedding semiconductor region 21a of a desired high resistance.

The second embedding semiconductor region 21b works as a current blocking region, like the current blocking region 21c, which confine current into the semiconductor mesa 19d, and is formed of a high resistance semiconductor. The high resistance semiconductor includes, for example, at least one of an undoped semiconductor or a semi-insulating semiconductor. The high resistance semiconductors, such as undoped and semi-insulating semiconductors, can reduce leakage current outside of the semiconductor mesa 19d and light absorption caused by carriers. In addition, the second embedding semiconductor region 21b may include at least one of, for example, InP and InGaAsP, which contain no aluminum as a constituent element, and can avoid degradation due to the oxidation of aluminum. As shown in FIGS. 7 and 8, the second widths W2 of the second recess 19m and the third recess 19n may be, for example, in the range of 10 to 70 micrometers.

In the quantum cascade semiconductor lasers 11a, 11b, and 11c, the semiconductor laminate region 19 and the first embedding semiconductor region 21a in the first region 13c reach the first end face 13a. The first embedding semiconductor region 21a extends to the first end face 13a of the laser structure 13 along the first and second side faces 19h and 19i of the first recess 19a, and reaches the upper edge of the substrate 17.

With reference to FIGS. 9 to 10, the quantum cascade laser 11d according to the present embodiment will be described below. In the quantum cascade laser 11d, as shown in FIG. 9, in the first region 13c, the semiconductor laminate region 19 includes a connecting laminate structure 19j. The first laminate structure 19b and the second laminated structure 19c reach the connecting laminate structure 19j. The first recess 19a is defined in three directions by the connecting laminate structure 19j and the first and second laminate structures 19b and 19c connected therewith, and is positioned in the remaining one direction by the end face 19e of the semiconductor mesa 19d. In the quantum cascade laser 11d, the first recess 19a is connected to the second and third recesses 19m and 19n, which extend along the semiconductor mesa 19d. The quantum cascade laser 11d has the same structure as that of the quantum cascade laser 11c, except for the above matter.

The first recess 19a is terminated by the connecting laminate structure 19j connecting the first laminate structure 19b and the second laminate structure 19c with each other. The connecting laminate structure 19j has a third side face 19p that terminates the first recess 19a. The first recess 19a extends from the third side face 19p of the connecting laminate structure 19j toward the end face 19e of the semiconductor mesa 19d along the first and second side faces 19h and 19i of the first and second laminate structures 19b and 19c. The first embedding semiconductor region 21a can be grown on a limited area isolated from another by the connecting laminate structure 19j.

Figure 11A:
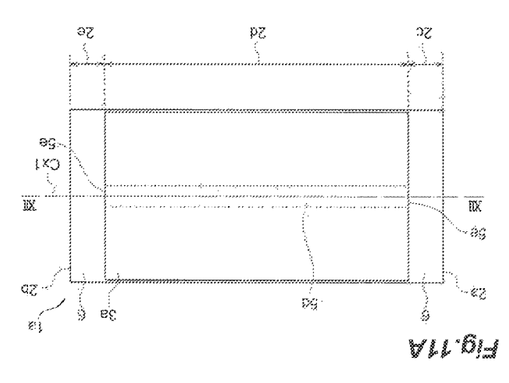
FIG. 11A is a view showing a quantum cascade semiconductor laser having a structure different from the quantum cascade semiconductor lasers according to the present embodiments.
Figure 11B:
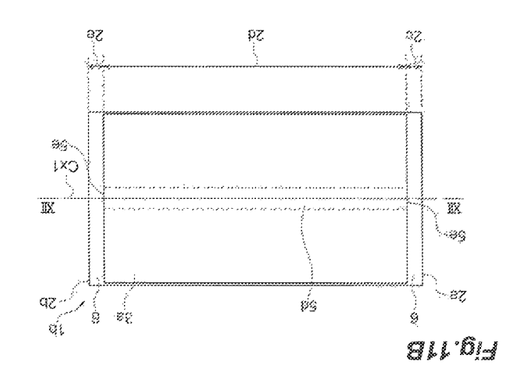
FIG. 11B is a view showing a quantum cascade semiconductor laser having a structure different from the quantum cascade semiconductor lasers according to the present embodiments.
Figure 12A:
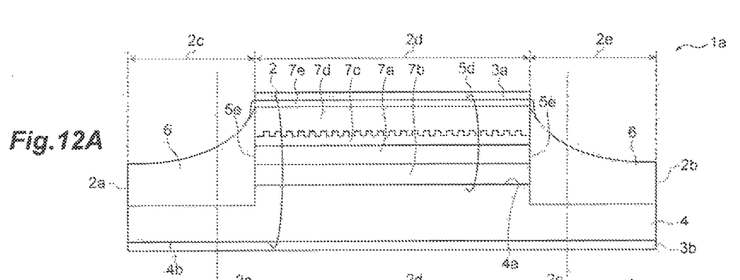
FIG. 12A is a cross-sectional view taken along line XII-XII shown in FIG. 11A.
Figure 12B:
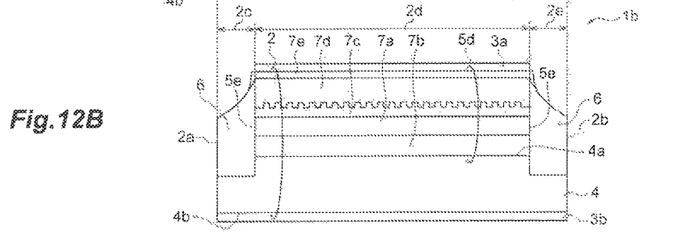
FIG. 12B is a cross-sectional view taken along line XII-XII shown in FIG. 11B.

FIGS. 11A and 11B are plan views showing quantum cascade semiconductor lasers 1a and 1b, respectively, which have structures different from the quantum cascade semiconductor laser according to the present embodiment. FIG. 12A is a cross sectional view, taken along line XII-XII in FIG. 11A, showing the quantum cascade semiconductor laser 1a, and FIG. 12B is a cross sectional view, taken along line XII-XII in FIG. 11B, showing the quantum cascade semiconductor laser 1b. The quantum cascade semiconductor lasers 1a and 1b each include a laser structure 2, a first electrode 3a, and a second electrode 3b. The laser structure 2 has a first end face 2a and a second end face 2b. The laser structure 2 includes a substrate 4, a semiconductor mesa 5d, and an embedding semiconductor region 6. The semiconductor mesa 5d and the embedding semiconductor region 6 are provided on the principal surface 4a of the substrate 4. The laser structure 2 includes a first region 2c, a second region 2d, and a third region 2e. The second region 2d is provided between the first region 2c and the third region 2e. The first region 2c, the second region 2d, and the third region 2e are arranged in the direction of the axis Cx1 from the first end face 2a to the second end face 2b. The second region 2d includes the substrate 4, and further includes a semiconductor mesa 5d. The first region 2c includes the substrate 4, and further includes an embedding semiconductor region 6. The semiconductor mesa 5d extends in the direction of the axis Cx1. The semiconductor mesa 5d has an end face 5e. The first electrode 3a is connected to the upper face of the semiconductor mesa 5d, and the second electrode 3b is connected to the back face 4b of the substrate 4. The embedding semiconductor region 6 of the first region 2c is provided to embed the end face 5e of the semiconductor mesa 5d. The semiconductor mesa 5d includes a core layer 7a for quantum cascade laser. Specifically, in addition to the core layer 7a, the semiconductor mesa 5d further includes, for example, a lower cladding layer 7b, a diffraction grating layer 7c, an upper cladding layer 7d, and a contact layer 7e.

The quantum cascade semiconductor laser 1a does not have any semiconductor laminate region in the first region 2c, so that the embedding semiconductor region 6 formed in the first region 2c decreases in thickness with the distance from the end face 5e of the semiconductor mesa 5d to form a curved surface. The embedding semiconductor region 6 thus formed reflects, at the curved surface thereof, light emitted from the semiconductor mesa 5d. In the quantum cascade semiconductor laser 1b in which the first region 2c has a short length, the embedding semiconductor region 6 also reflects light emitted from the semiconductor mesa 5d at the curved surface thereof. The embedding semiconductor region 6 of this structure also has, in the third region 2e, another curved surface that has a shape similar to that of the first region 2c.

An exemplary quantum cascade semiconductor laser 11 according to the present embodiment will be described below. In the quantum cascade semiconductor laser 11, the semiconductor laminate region 19 of the first region 13c has the first recess 19a. The first recess 19a extends from the end face 19e of the semiconductor mesa 19d, and is defined by the first and second side faces 19h and 19i each extending in the direction of the first axis Ax1. The first recess 19a is embedded by the first embedding semiconductor region 21a. This embedding process uses selective growth, which allows semiconductor to grow on semiconductor side faces associated with the first and second side faces 19h and 19i and the end face 19e of the semiconductor mesa 19d, thereby providing the first embedding semiconductor region 21a with an excellent flatness.

EXAMPLE

The semiconductor mesa of the quantum cascade semiconductor laser according to the present embodiment includes, for example, an n-type lower cladding layer 23b, a core layer 23a, a diffraction grating layer 23c, an n-type upper cladding layer 23d, and an n-type contact layer 23e. The semiconductor mesa 19d is produced by using photolithography and etching from a laminate made of III-V group compound semiconductor layers for the lower cladding layer 23b, the core layer 23a, the diffraction grating layer 23c, the upper cladding layer 23d, and the contact layer 23e. The laminate is provided on the substrate 17 of n-type semiconductor. These semiconductors are grown on the n-type semiconductor substrate by, for example, organometallic vapor phase epitaxy or molecular beam epitaxy.

The substrate 17 includes a semiconductor substrate, and the semiconductor substrate can be, for example, an n-type InP substrate. Semiconductor layers constituting the mid-infrared quantum cascade semiconductor laser each include a group III-V compound semiconductor having a lattice constant close to that of InP. The use of the InP substrate can provide the above semiconductors with a good crystal quality. In addition, the InP substrate is substantially transparent to light in mid-infrared wavelengths in terms of optical property. This optical property allows the InP substrate to work as the lower cladding layer.

The upper and lower cladding layers 23d and 23b each may include, for example, an n-type InP semiconductor. As described above, InP is transparent to mid-infrared light, and can provide the quantum cascade semiconductor laser with a cladding layer of a low optical-loss. Further, InP is a binary mixed crystal, and enables good crystal growth on the surface of the substrate 17 of InP. In addition, InP exhibits good conduction of heat among semiconductor materials usable for mid-infrared quantum cascade semiconductor lasers. For example, the InP cladding layer provides an excellent dissipation of heat from the core region, and improve the temperature performance of the quantum cascade semiconductor laser. The lower cladding layer is optional, and if possible, the semiconductor substrate can be used as the lower cladding region.

The core layer 23a includes unit structures connected in multiple stages, for example, several tens of cycles, and each of the unit structures includes a pair of an active layer and an injection layer. The active layer and the injection layer each include a quantum well layer of a thin film with a thickness of several nanometers, and a barrier layer of a thin film having a thickness of several nanometers and a band gap higher than that of the quantum well layer. The well layers and the barrier layers in the core layer 23a are alternately arranged to form a superlattice. The quantum cascade semiconductor laser produces a mid-infrared light, which is generated by transiting single-polarity carriers, for example electrons, from the upper level to the lower level of the subband in the conduction band in the active layer. The mid-infrared light is amplified in the optical cavity, allowing laser oscillation to occur in the mid-infrared wavelength region. In order to enable the lasing in the mid-infrared wavelength region, the quantum well layers each include, for example, GaInAs and/or GaInAsP, and the barrier layers each include, for example, AlInAs. These materials are used in an array of superlattices constituting the active layer, thereby allowing the quantum cascade semiconductor laser to lase in a mid-infrared wavelength region (for example, a wavelength range of 3 to 20 micrometers) through the inter-subband transition in the conduction band.

As shown in FIG. 2, the quantum cascade semiconductor laser may be, for example, a distributed feedback type quantum cascade semiconductor laser, which has a periodic structure (periodic structure for diffraction grating) enabling wavelength selection and extending in the direction in which the semiconductor mesa 19d extends. The periodic structure for the diffraction grating is formed by photolithography and etching. The diffraction grating selectively reflects light of a Bragg wavelength associated with the period, thereby enabling single mode oscillation. In order to enable the single mode oscillation in the quantum cascade semiconductor laser, the diffraction grating layer includes a semiconductor of high refractive index, such as undoped or n-type GaInAs.

The current blocking layer 21c and the embedding semiconductor regions 21a and 21b each can include a semiconductor which has a high resistance of undoped or semi-insulating material and is lattice-matched to InP. The semi-insulating semiconductor is provided by electron traps of deep levels, located in the bandgap of compound semiconductors, which are formed by doping host semiconductor with a transition metal(s), such as Fe, Ti, Cr, and Co. Specifically, iron (Fe) can be used as the dopant. The addition of a transition metal, such as iron (Fe), to InP increase specific resistance of, for example, $10^5$ Ωcm or more, to electron. If possible. the undoped semiconductor can be used for a high resistance semiconductor in the current blocking layer and the embedding semiconductor regions. The host semiconductor for undoped or semi-insulating material can be a compound semiconductor, such as InP, GaInAsP, AlGaInAs, AlInAs, and GaInAs.

If necessary, an insulating film 25 is formed on the current blocking layer 21c and the embedding semiconductor regions 21a and 21b. The insulating film 25 may have, for example, a dielectric insulating property and may include a dielectric film, such as $SiO_2$, SiON, SiN, alumina, benzocyclobutene (BCB), and polyimide. These dielectric films can be formed by a film forming apparatus, such as sputtering, chemical vapor deposition (CVD), and spin coating. The insulating film 25 can enhance electrical insulation between the first electrode 15a and the basal semiconductor layer, tightly confine current into the semiconductor mesa 19d, and prevent the semiconductor surface from being open to the atmosphere.

The first electrode 15a and the second electrode 15b each may include, for example, Ti/Au, Ti/Pt/Au, or Ge/Au. These electrodes are formed through, for example, formation of metal films by plating and/or vapor deposition, and patterning of the metal films by lift-off.

If necessary, the quantum cascade semiconductor laser according to the embodiment may include a lower optical confinement layer, which is disposed between the core layer 23a and the lower cladding layer 23b, and an upper optical confinement layer, which is disposed between the core layer 23a and the diffraction grating layer 23c. These optical confinement layers each have a refractive index higher than the refractive indices of the upper and lower cladding layers 23d and 23b, and are preferably made of material that can be lattice-matched to a semiconductor substrate (for example, InP), such as, an undoped or n-type GaInAs.

In order to obtain a good ohmic contact between the first electrode 15a and the semiconductor mesa 19d, the semiconductor mesa 19d may have a contact layer 23e, which is disposed on the upper cladding layer 23d. The contact layer 23e can be made of material having a low bandgap and lattice-matched to the InP substrate 17, for example, n-type GaInAs, such that the first electrode 15a makes good ohmic contact with the contact layer 23e.

The first embedding semiconductor region 21a covers the end face 19e of the semiconductor mesa 19d. The first embedding semiconductor region 21a includes a compound semiconductor of a bandgap larger than the photon energy of the lasing light that is emitted by the quantum cascade semiconductor laser 11 according to the embodiment. In addition, in order to reduce a leakage current flowing through the first embedding semiconductor region 21a, the first embedding semiconductor region 21a may include a semiconductor of high resistivity, such as, an undoped semiconductor and/or a semi-insulating semiconductor, specifically a semi-insulating semiconductor doped with transition metal, such as Fe-doped InP and Fe-doped GaInAsP. Preferably, the first embedding semiconductor region 21a includes a group III-V compound semiconductor containing no aluminum as a constituent element, such as InP, GaInAsP, and such materials are free from the oxidation of aluminum that may form defects therein.

The second embedding semiconductor region 21b or the current blocking region 21c covers the side face of the semiconductor mesa 19d. The second embedding semiconductor region 21b and the current blocking region 21c may be made of substantially the same material as that of the first embedding semiconductor region 21a in terms of constituent elements and composition. The first embedding semiconductor region 21a and the second embedding semiconductor region 21b may be fabricated in the same growth process simultaneously. Alternatively, the first embedding semiconductor region 21a and the current blocking region 21c may be fabricated in the same growth process simultaneously. These processes can simplify the manufacturing process. The current blocking region 21c, the first embedding semiconductor region 21a, and the second embedding semiconductor region 21b, which use an undoped or semi-insulating semiconductor, can reduce optical absorption caused by free carriers in these regions, thereby avoiding the deterioration in the performance of the quantum cascade semiconductor laser.

The first and second laminate structures 19b and 19c each may have the same semiconductor layer laminate as that of the semiconductor mesa 19d. The end face 19e of the semiconductor mesa 19d, the first side face 19h of the first laminate structure 19b, and second side face 19i of the second laminated structure 19c support the first embedding semiconductor region 21a.

The method of forming the first and second embedding semiconductor regions 21a and 21b can include, for example, the following steps. Multiple semiconductor layers for the semiconductor mesa 19d, the first laminate structure 19b, and the second laminate structure 19c are grown on the semiconductor substrate 17 to form a semiconductor laminate. A mask defining, for example, the the semiconductor mesa 19d, the first laminate structure 19b, and the second laminate structure 19c, e.g., the dielectric mask of a silicon based inorganic insulator, such as SiN or $SiO_2$, is formed on the top face of the semiconductor laminate. The semiconductor laminate is etched using the dielectric mask to form the semiconductor mesa 19d, the first laminate structure 19b, and the second laminate structure 19c. The first and second laminate structures 19b and 19c define the first recess 19a, which extends from the end face 19e of the semiconductor mesa 19d, and the first recess 19a has a width W0 equal to the interval between the first and second laminate structures 19b and 19c. The regrowth of semiconductor with the dielectric mask remaining causes semiconductor deposition on the end face 19e of the semiconductor mesa 19d, the first side face 19h of the first laminate structure 19b, and the second side face 19i of the second laminated structure 19c to fill the first recess 19a therewith, and finally forms the first embedding semiconductor region 21a having a flat surface. As already explained, the width W0 of the first recess 19a is defined as the distance between the first laminate structure 19b and the second laminate structure 19c. The depositions on not only the end face 19e of the semiconductor mesa 19d but also the first and second side faces 19h and 19i of the first and second laminate structures 19b and 19c in the regrowth process contribute to making the first recess 19a filled. These contributions on the three faces allow the first embedding semiconductor region 21a to have a desired flatness. The distance between the first laminate structure 19b and the second laminate structure 19c (referred to as the width W0 of the first recess 19a) can be, for example, 10 micrometers or more, and can be 70 micrometers or less. Such a range can reduce the occurrence of abnormal growth in the regrowth process, and can provide the top face of the first embedding semiconductor region 21a with an excellent flatness.

In the quantum cascade semiconductor laser according to the embodiment, the first embedding semiconductor region 21a with a flat surface reaches the first end face 13a of the laser structure 13. Around the first end face 13a, the height of the upper face of the first embedding semiconductor region 21a is substantially equal to the heights of the upper faces of the first and second laminate structures 19b and 19c. As shown in FIG. 1, the quantum cascade semiconductor laser according to the embodiment has an optical cavity including the first and second end faces 13a and 13b, and the first and second end faces 13a and 13b are located close to the respective end faces 19e of the semiconductor mesa 19d. Around the first and second end faces 13a and 13b, the first embedding semiconductor region 21a, the first laminate structure 19b and the second laminated structure 19c have substantially the same height, thereby allowing the first embedding semiconductor region 21a to have an excellent flat surface. This excellent flatness can reduce irregular reflection of emitted light beams in the vicinity of the facets of the optical cavity, and can prevent disturbance in the cross-sectional shape of the outgoing beam. These advantages result in an excellent optical coupling between the quantum cascade semiconductor laser and an optical system, such as optical fibers and lenses. The excellent optical coupling in an optical system including such a quantum cascade semiconductor laser makes the effective light output high.

Alternatively, in the quantum cascade semiconductor laser according to the embodiment, the first and second end faces 13a and 13b may be disposed at respective positions apart from the end faces 19e of the semiconductor mesa 19d as shown in FIG. 5.

Referring to FIG. 4 again, the quantum cascade laser according to the embodiment includes the current blocking region 21c which embeds the side faces of the semiconductor mesa 19d. The current blocking region 21c is made of either the same undoped or semi-insulating semiconductor material as that of the first embedding semiconductor region 21a. If possible, the first and second embedding semiconductor regions 21a and 21b, and/or the current blocking region 21c may be grown together in the same process.

As shown in FIG. 2, the quantum cascade semiconductor laser according to the embodiment may have a distributed feedback structure, alternatively may have a Fabry-Perot structure which has no diffraction grating layer 23c. In addition, the first embedding semiconductor region 21a may be formed in only either of the first region 13c or the third region 13e. Furthermore, one of the first region 13c and the third region 13e includes the first embedding semiconductor region 21a, and the other region may be provided with another structure, for example, a Bragg reflector providing the other facet with a high reflection.

As shown in FIGS. 7 and 8, the quantum cascade semiconductor laser according to the embodiment includes the second recess 19m and the third recess 19n in addition to the first recess 19a. The first recess 19a is filled with the first embedding semiconductor region 21a of a flat surface, and the second and third recesses 19m and 19n are filled with the second embedding semiconductor region 21b of a flat surface. With the second and third recesses 19m and 19n in addition to the first recess 19a, the source gas for semiconductor growth is consumed on the regions that are predetermined by the recesses, thereby causing the embedding semiconductor to selectively grow thereon. Connecting the first, the second and the third recesses 19a, 19m, and 19n makes the difference in consumption of raw materials among the recesses small, reducing the difference in growth rate in the first, the second and the third recesses 19a, 19m, and 19n. The small difference in growth rate can improve the flatness of the embedding region over these recesses.

In the quantum cascade semiconductor laser according to the embodiment, as shown in FIGS. 9 and 10, the first recess 19a is set back from the first end face 13a, and terminates at a position away from the first end face 13a. This structure makes the width and length of the first recess 19a reduced, and also makes the area of the opening of the etching mask defining the first recess 19a reduced. Making the area of the semiconductor stack to be etched small can substantially increase the etching rate in the etching process for forming the first recess 19a. Further, reducing the area on which semiconductor that embeds the first recess 19a is to be re-grown can also increase the growth rate in the regrowth process. The structure of the first recess 19a shown in FIGS. 9 and 10 can be used for other structures, for example, the quantum cascade semiconductor laser shown in FIG. 1.

The quantum cascade lasers as described in the embodiments each have a buried-hetero (BH) structure in which sides of the semiconductor mesa are buried with a current blocking region or a second embedding semiconductor region. The quantum cascade laser according to the embodiments each may, however, have another current confinement structure, which is different from the buried-hetero (BH) structure, and may have, for example, a high mesa structure. The high mesa structure includes a semiconductor mesa having side faces covered with a dielectric insulating film, such as SiO$_2$, SiON, and SiN, and includes neither the current blocking region nor the second embedding semiconductor region.

Figure 13:
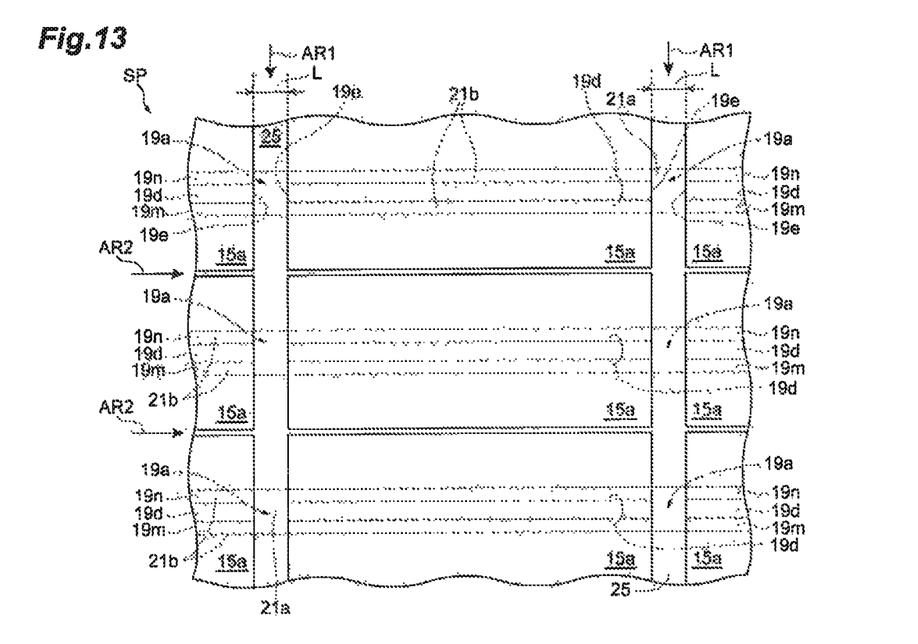
FIG. 13 is a plan view showing a substrate product for the quantum cascade laser according to the present embodiment.

FIG. 13 is a plan view showing a substrate product including a plurality of device sections, each of which is prepared for the laser device. Referring to FIG. 13, nine device sections of the substrate product SP are shown. The distance between the end faces 19e of the semiconductor mesas 19d in adjoining device sections is twice as large as the length of the first region 13c (referred to as "L1" in FIG. 1), and is represented as the length 2×L1 (referred to as "L"). The first and second laminate structures 19b and 19c made of the laminate structure 23 and the first embedding semiconductor region 21a are separated by cleavage into a laser bar(s). The separation is carried out along a center line (indicated by arrow "AR1") in the area of length L (=2×L1). In the separated device section, the distance between the end face 19e of the semiconductor mesa 19d and the first end face 13a is, for example, the length L/2 (=L1). The length L is, for example, in the range of 10 to 50 micrometers. The laser bar thus produced is separated by cleavage at a separation line (indicated by arrow "AR2") into a laser chip(s). The structure of the substrate product SP can use the above-described interval L, and can maximize the yield of chips obtained from the substrate product SP without a separating margin between device sections for adjacent chips.

As seen from the above description, the quantum cascade laser can prevent the diffuse reflection in the vicinity of the end face of the semiconductor mesa thereof.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A quantum cascade laser comprising a laser structure including a first end face and a second end face opposite to the first end face, the laser structure including a substrate having a principal surface, a semiconductor laminate region, and a first embedding semiconductor region, the semiconductor laminate region and the first embedding semiconductor region being disposed on the principal surface of the substrate, the laser structure including a first region and a second region that are arranged in a direction of a first axis extending from the first end face to the second end face,
  each of the first region and the second region including the semiconductor laminate region,
  the semiconductor laminate region of the first region having a recess extending in the direction of the first axis,
  the semiconductor laminate region of the second region having a semiconductor mesa extending in the direction of the first axis, the semiconductor mesa having a core layer,
  the semiconductor mesa having an end face extending in a direction of a second axis intersecting the first axis,
  the semiconductor mesa and the recess being aligned with each other,
  the first embedding semiconductor region being disposed in the recess so as to embed the end face of the semiconductor mesa, wherein
  the recess is defined by first and second side faces of the semiconductor laminate region and the end face of the semiconductor mesa, and
  the first embedded semiconductor region is in contact with the end face of the semiconductor mesa and the first and the second side faces.

2. The quantum cascade laser according to claim 1, wherein
  the semiconductor laminate region includes a first laminate structure and a second laminate structure each extending in the direction of the first axis,
  in the second region, the semiconductor mesa is disposed between the first laminate structure and the second laminate structure,
  in the first region, the first laminate structure and the second laminate structure respectively provide the first and the second side faces of the semiconductor laminate region to define the recess,
  the second region of the laser structure includes a second embedding semiconductor region, and
  in the second region, the second embedding semiconductor region is disposed between the first laminate structure and the semiconductor mesa and between the second laminate structure and the semiconductor mesa.

3. The quantum cascade laser according to claim 2, wherein
  the semiconductor laminate region of the first region includes a connecting laminate structure, and
  the first laminate structure and the second laminate structure reach the connecting laminate structure.

4. The quantum cascade laser according to claim 1, wherein the first embedding semiconductor region and the semiconductor laminate region of the first region reach the first end face.

5. The quantum cascade laser according to claim 1, wherein the first embedding semiconductor region includes at least one of undoped semiconductor or semi-insulating semiconductor.

6. The quantum cascade laser according to claim 1, wherein the first embedding semiconductor region is made of at least one of InP or InGaAsP.

7. The quantum cascade laser according to claim 1, wherein
the laser structure further includes a current blocking region disposed on a side face of the semiconductor mesa, the current blocking region embedding the semiconductor mesa, and
the first embedding semiconductor region is made of substantially the same material as that of the current blocking region.

8. The quantum cascade laser according to claim 1, wherein
the substrate has a ridge portion on which the semiconductor mesa is disposed,
the substrate is made of semiconductor having cleavability,
the semiconductor laminate region is made of semiconductor having cleavability, and
the first embedding semiconductor region is made of semiconductor having cleavability.

9. The quantum cascade laser according to claim 1, wherein the first and the second end faces each have a cleavage plane.

10. A quantum cascade laser comprising a laser structure comprising a first end face and a second end face opposite to the first end face, the laser structure including a substrate having a principal surface, a semiconductor laminate region, and a first embedding semiconductor region, the semiconductor laminate region and the first embedding semiconductor region being disposed on the principal surface of the substrate, the laser structure including a first region and a second region that are arranged in a direction of a first axis extending from the first end face to the second end face,
each of the first region and the second region including the semiconductor laminate region,
the semiconductor laminate region of the first region having a recess extending in the direction of the first axis,
the semiconductor laminate region of the first region having a first side face and a second side face that extend in the direction of the first axis to form the recess,
the semiconductor laminate region of the second region having a semiconductor mesa extending in the direction of the first axis, the semiconductor mesa having a core layer,
the semiconductor mesa having an end face extending in a direction of a second axis intersecting the first axis,
the semiconductor mesa and the recess being aligned with each other,
the first embedding semiconductor region being disposed in the recess so as to embed the end face of the semiconductor mesa and the first and the second side faces of the semiconductor laminate region, and
the semiconductor mesa and the semiconductor laminate region supporting the first embedding semiconductor region on the end face of the semiconductor mesa and the first and the second side faces of the semiconductor laminate region.

11. The quantum cascade laser according to claim 10, wherein
the semiconductor laminate region includes a first laminate structure and a second laminate structure each extending in the direction of the first axis,
in the second region, the semiconductor mesa is disposed between the first laminate structure and the second laminate structure,
in the first region, the first laminate structure and the second laminate structure respectively provide the first and the second side faces of the semiconductor laminate region to define the recess,
the second region of the laser structure includes a second embedding semiconductor region, and
in the second region, the second embedding semiconductor region is disposed between the first laminate structure and the semiconductor mesa and between the second laminate structure and the semiconductor mesa.

12. The quantum cascade laser according to claim 10, wherein
the semiconductor laminate region of the first region includes a connecting laminate structure, and
the first laminate structure and the second laminate structure reach the connecting laminate structure.

13. The quantum cascade laser according to claim 10, wherein the first embedding semiconductor region and the semiconductor laminate region of the first region reach the first end face.

14. The quantum cascade laser according to claim 10, wherein
the first embedding semiconductor region includes at least one of undoped semiconductor or semi-insulating semiconductor in contact with the end face of the semiconductor mesa and the first and the second side faces of the semiconductor laminate region.

15. The quantum cascade laser according to claim 10, wherein
the laser structure further includes a current blocking region,
the current blocking region embeds the semiconductor mesa, and
the current blocking region includes at least one of undoped semiconductor or semi-insulating semiconductor in contact with a side face of the semiconductor mesa.

16. The quantum cascade laser according to claim 10, further comprising an electrode on the semiconductor mesa and connected to a top of the semiconductor mesa.

17. The quantum cascade laser according to claim 16, wherein the electrode is not in contact with the first embedding semiconductor region.

18. The quantum cascade laser according to claim 10, further comprising an insulating film, the insulating film being disposed on the first embedding semiconductor region and the semiconductor laminate region of the first region.

19. The quantum cascade laser according to claim 16, wherein
the semiconductor mesa includes a lower cladding layer, a grating layer, and an upper cladding layer, and
the lower cladding layer, the grating layer, and the upper cladding layer terminate at the first end face.

20. The quantum cascade laser according to claim 10, wherein the first and the second end faces each have a cleavage plane.

* * * * *